(12) United States Patent
Kumamoto et al.

(10) Patent No.: US 9,379,086 B2
(45) Date of Patent: Jun. 28, 2016

(54) METHOD OF MANUFACTURING SEMICONDUCTOR DEVICE

(71) Applicant: SHINKAWA LTD., Tokyo (JP)

(72) Inventors: Shinji Kumamoto, Tokyo (JP); Naoki Sekine, Tokyo (JP); Motoki Nakazawa, Tokyo (JP); Yasuo Nagashima, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/883,629

(22) Filed: Oct. 15, 2015

(65) Prior Publication Data
US 2016/0035695 A1 Feb. 4, 2016

Related U.S. Application Data

(63) Continuation of application No. PCT/JP2014/051541, filed on Jan. 24, 2014.

(30) Foreign Application Priority Data

Apr. 15, 2013 (JP) ................................. 2013-084801

(51) Int. Cl.
*H01L 21/00* (2006.01)
*H01L 23/00* (2006.01)
(Continued)

(52) U.S. Cl.
CPC ................ *H01L 24/85* (2013.01); *H01L 24/48* (2013.01); *H01L 24/78* (2013.01); *H01L 25/065* (2013.01); *H01L 25/07* (2013.01); *H01L 25/18* (2013.01); *H01L 25/50* (2013.01); *H01L 2224/45144* (2013.01); *H01L 2224/45147* (2013.01); *H01L 2224/4809* (2013.01);
(Continued)

(58) Field of Classification Search
None
See application file for complete search history.

(56) References Cited

U.S. PATENT DOCUMENTS 5,192,018 A * 3/1993 Terakado ............. B23K 20/007
228/179.1
5,967,401 A * 10/1999 Nishiura ............. B23K 20/007
228/180.5

(Continued)

FOREIGN PATENT DOCUMENTS

JP 2001-101636 4/2001
JP 2003-318216 11/2003

(Continued)

OTHER PUBLICATIONS

"International Preliminary Report on Patentability of PCT/JP2014/051541", completed on Jan. 13, 2015, by JPO, with partial English translation, pp. 1-4.

*Primary Examiner* — Angel Roman
(74) *Attorney, Agent, or Firm* — Jianq Chyun IP Office (57) ABSTRACT

A semiconductor device includes a common wire that sequentially connects three or more pads; bonding portions at which a side surface of the wire is bonded to the pads; and looping portions looped from the bonding portions onto the other pads adjacent to the pads, the bonding portions and the looping portions are formed alternately. When the pads are recessed from the surface of semiconductor chips, the common wire is crushed to a thickness greater than the recess depth of the pads to be made into a flat shape. Thus, on the semiconductor device, wire connection is performed with a smaller bonding count while reducing damage to the semiconductor chips, and at the same time bonding is performed efficiently to the electrodes recessed from the surface of the semiconductor chips.

4 Claims, 9 Drawing Sheets

(51) Int. Cl.
*H01L 25/065* (2006.01)
*H01L 25/07* (2006.01)
*H01L 25/18* (2006.01)
*H01L 25/00* (2006.01)

(52) U.S. Cl.
CPC ............... *H01L 2224/48147* (2013.01); *H01L 2224/48227* (2013.01); *H01L 2224/48228* (2013.01); *H01L 2224/48455* (2013.01); *H01L 2224/48465* (2013.01); *H01L 2224/78301* (2013.01); *H01L 2224/85181* (2013.01); *H01L 2224/85205* (2013.01); *H01L 2225/06506* (2013.01); *H01L 2225/06562* (2013.01)

(56) References Cited

U.S. PATENT DOCUMENTS

| | | | | |
|---|---|---|---|---|
| 6,207,549 | B1 * | 3/2001 | Higashi | H01L 24/11 257/E21.508 |
| 6,213,384 | B1 * | 4/2001 | Nishiura | B23K 20/004 228/1.1 |
| 7,780,064 | B2 * | 8/2010 | Wong | B23K 20/004 228/1.1 |
| 2003/0010806 | A1 | 1/2003 | Itoh et al. | |
| 2009/0314822 | A1 * | 12/2009 | Qin | B23K 20/005 228/102 |
| 2010/0148369 | A1 * | 6/2010 | Mii | B23K 20/007 257/773 |
| 2010/0207280 | A1 * | 8/2010 | Mii | H01L 24/48 257/784 |
| 2010/0237480 | A1 | 9/2010 | Mii et al. | |

FOREIGN PATENT DOCUMENTS

| | | |
|---|---|---|
| JP | 3573133 | 10/2004 |
| JP | 3662461 | 6/2005 |
| JP | 2005-340777 | 12/2005 |
| JP | 2009-076783 | 4/2009 |
| WO | 2009037878 | 3/2009 |

* cited by examiner

METHOD OF MANUFACTURING SEMICONDUCTOR DEVICE

CROSS REFERENCE TO RELATED APPLICATIONS

This application is a Continuation of PCT International Application No. PCT/JP2014/051541, filed on Jan. 24, 2014, which claims priority under 35 U.S.C §119(a) to Patent Application No. 2013-084801, filed in Japan on Apr. 15, 2013, all of which are hereby expressly incorporated by reference into the present application.

TECHNICAL FIELD

The present invention relates to methods for manufacturing semiconductor devices.

BACKGROUND ART

In recent years, demand for increased capacity of semiconductor devices has resulted in frequent use of stacked semiconductor devices formed by stacking a plurality of semiconductor chips on a substrate or a leadframe. For such stacked semiconductor devices, which are at the same time required to be thinner and smaller, a wire bonding method in which pads on adjacent semiconductor chips and a pad on a semiconductor chip and a lead of a leadframe are sequentially connected to each other with wire is used, instead of connecting pads on semiconductor chips in respective layers and a leadframe separately. This method uses a method in which, in order to prevent damage to semiconductor chips during wire bonding, first, a bump is formed on each pad on each semiconductor chip, then reverse bonding is performed from a lead of a leadframe onto a pad on a semiconductor chip, and further next reverse bonding is performed from the top of the bump to which bonding has been performed onto a bump on an adjacent semiconductor chip, whereby wire is sequentially connected from the leadframe to a pad on a semiconductor chip in the uppermost layer (for example, referring to Patent Literature 1).

There is proposed another method in which a bump is formed on each pad surface located on intermediate layers of a stacked semiconductor device, ball bonding is performed on a pad on a semiconductor chip in the uppermost layer, wire is looped onto a bump formed on a pad on an intermediate layer to be bonded onto the bump, then the wire is further looped onto a bump on the next semiconductor chip to be bonded, whereby the pads on adjacent intermediate layers are connected to each other with the wire (for example, referring to Patent Literature 2).

CITATION LIST

Patent Literature

Patent Literature 1: Japanese Patent No. 3573133
Patent Literature 2: Japanese Patent No. 3662461

SUMMARY OF INVENTION

Technical Problem

However, the conventional technology of Patent Literature 1 has a problem that it has a large number of process steps and bonding takes time and cost because wire bonding is performed after a bump is formed on a pad on each semiconductor chip. For example, connection between each pad on a stacked semiconductor stacked in two layers and a lead requires a total of four steps with steps of forming respective bumps on pads on semiconductor chips in the two layers (two steps), bonding between the lead and the bump on the pad on the first-layer semiconductor chip, and bonding between the first-layer bump and the bump on the pad on the second-layer semiconductor chip. In the conventional technology of Patent Literature 2, the number of process steps is smaller than that in the conventional technology of Patent Literature 1 because bonding is performed after bumps are formed on pads on semiconductor chips located in intermediate layers, but a bump formation step needs to be provided in addition to a bonding step, and the problem of a large number of process steps is not solved.

Further, semiconductor chips with pads recessed below the surface of the semiconductor chips are often used. When bonding is performed onto a pad recessed from the surface of a semiconductor chip, in order to prevent the tip of a capillary from contacting the surface of the semiconductor chip around the pad, the amount of pressing of wire (the amount of sinking of the capillary) cannot be increased. Therefore, it is necessary to form a bump on the pad, then perform bonding onto the bump as in the conventional technologies of Patent Literatures 1 and 2, thus posing a problem that efficient bonding cannot be performed.

The present invention has an object of performing wire connection with a lower bonding count while reducing damage to semiconductor chips. Further, the present invention has an object of performing efficient bonding to an electrode recessed from the surface of a semiconductor chip.

Solution to Problem

A method of manufacturing a semiconductor device of the present invention includes a bonding step of pressing a side surface of a common wire against a first electrode with a capillary and bonding the side surface of the common wire to the first electrode, and a looping step of looping the common wire onto a second electrode with the capillary after the bonding step, and the bonding step and the looping step are repeated alternately to sequentially connect three or more electrodes on semiconductor chips and a substrate with the common wire, the looping step comprises: a first raising step of raising the capillary vertically from the first electrode after the bonding step; a first obliquely moving step of moving the capillary obliquely downward toward the second electrode after the first raising step; a second raising step of raising the capillary vertically again after the first obliquely moving step; a reverse step of moving the capillary obliquely downward in a direction opposite to the second electrode after the second raising step; a second obliquely moving step of moving the capillary obliquely upward to directly above the first electrode after the reverse step; a third raising step of raising the capillary vertically again after the second obliquely moving step; and an arcuately moving step of moving the capillary in an arc to directly above the second electrode after the third raising step.

In the method of manufacturing the semiconductor device of the present invention, in the bonding step, preferably, the common wire is crushed to a thickness of ¼ to ½ of its diameter with the capillary to be made into a flat shape, and at the same time, the common wire is ultrasonically vibrated to be bonded to each of the electrodes.

In the method of manufacturing the semiconductor device of the present invention, in the reverse step, the capillary is preferably moved to a point at which an angle with respect to a line perpendicular to the electrode and passing through the bonding portion becomes 10° to 20°.

In the method of manufacturing the semiconductor device of the present invention, preferably, at least one of the electrodes is a pad recessed from the surface of the semiconductor chip, and in the bonding step, the common wire is crushed with the capillary to a thickness greater than a recess depth of the pad to be made into a flat shape, and at the same time, the common wire is ultrasonically vibrated to be bonded to the pad.

Advantageous Effects of Invention

The present invention has an effect of allowing wire connection to be performed with a smaller bonding count while reducing damage to semiconductor chips, and at the same time allowing bonding to be performed efficiently to an electrode recessed from the surface of a semiconductor chip.

BRIEF DESCRIPTION OF DRAWINGS

Exemplary embodiments of the present invention will be described in detail based on the following figures, wherein.

DESCRIPTION OF EMBODIMENTS

Figure 1:
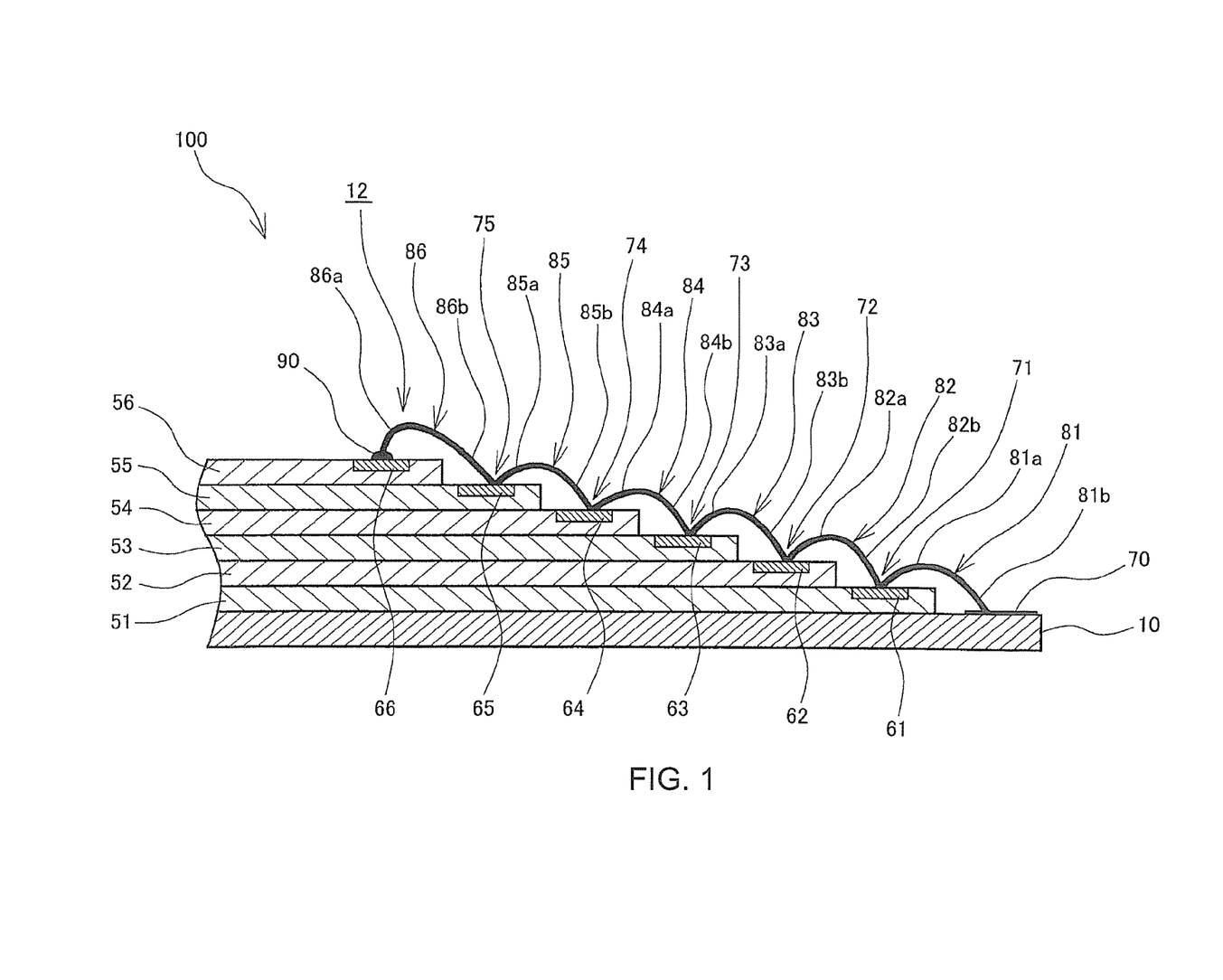
FIG. 1 is a cross-sectional view showing a structure of a semiconductor device manufactured by a method for manufacturing semiconductor device according to an exemplary embodiment of the present invention.

Hereinafter, with reference to the drawings, an exemplary embodiment of the present invention will be described. As shown in FIG. 1, a semiconductor device 100 manufactured by a method for manufacturing semiconductor device of this exemplary embodiment has a stacked body with semiconductor chips 56 to 51 stacked in multiple layers on a substrate 10, and has pads 66 to 61, electrodes provided on the surface of the semiconductor chips 56 to 51, sequentially connected with a single common wire 12. As shown in FIG. 1, the semiconductor chips 56 to 51 are semiconductor chips in layers adjacent to each other, and the pads 66 to 61 are pads in layers adjacent to each other. The pads 66 to 61 are also pads adjacent to each other. The common wire 12 can be a gold wire, or can be an aluminum wire, a copper wire, or the like. The common wire 12 is ball-bonded onto the pad 66 on the semiconductor chip 56 in the uppermost tier, and a press-bonded ball 90 is formed on the pad 66. A looping portion 86 into which the wire 12 is looped in an arc is formed from a starting end portion 86a on the press-bonded ball 90 side to an ending end portion 86b on the side of the pad 65 on the semiconductor chip 55 in the next tier. At the ending end portion 86b of the looping portion 86, a side surface of the wire 12 is pressed and bonded onto the pad 65 to form a bonding portion 75. Then, the wire 12 is again looped in an arc from a starting end portion 85a on the bonding portion 75 side to an ending end portion 85b on the side of the pad 64 on the semiconductor chip 54 in the next layer, forming an arc-shaped looping portion 85 heading from the starting end portion 85a on the pad 65 side to the ending end portion 85b on the pad 64 side. At the ending end portion 85b of the looping portion 85, a side surface of the wire 12 is pressed and bonded onto the pad 64 to form a bonding portion 74. Likewise, a looping portion 84, a bonding portion 73, a looping portion 83, a bonding portion 72, a looping portion 82, and a bonding portion 71 are sequentially formed, and finally the wire 12 is looped from the pad 61 onto an electrode 70 on the substrate 10, and bonded at its side surface onto the electrode 70 and then cut off. Thus, on the semiconductor device 100 in this exemplary embodiment, the pads 66 to 61 on the semiconductor chips 56 to 51 and the electrode 70 on the substrate 10 are sequentially connected with the single common wire 12.

In other words, as shown in FIG. 1, the semiconductor device 100 has the looping portions 86 to 82 and the bonding portions 75 to 71 formed alternately to sequentially connect the five pads 65 to 61 on the semiconductor chips 55 to 51 in adjacent layers with the single wire 12. In the semiconductor device 100, ball bonding is performed on the pad 66 on the semiconductor chip 56 in the uppermost tier to bond the wire 12 and the pad 66, but the bonding method is not limited to this. A side surface of the wire 12 may be bonded to the surface of the pad 66 as at the bonding portions 75 to 72.

Figure 2:
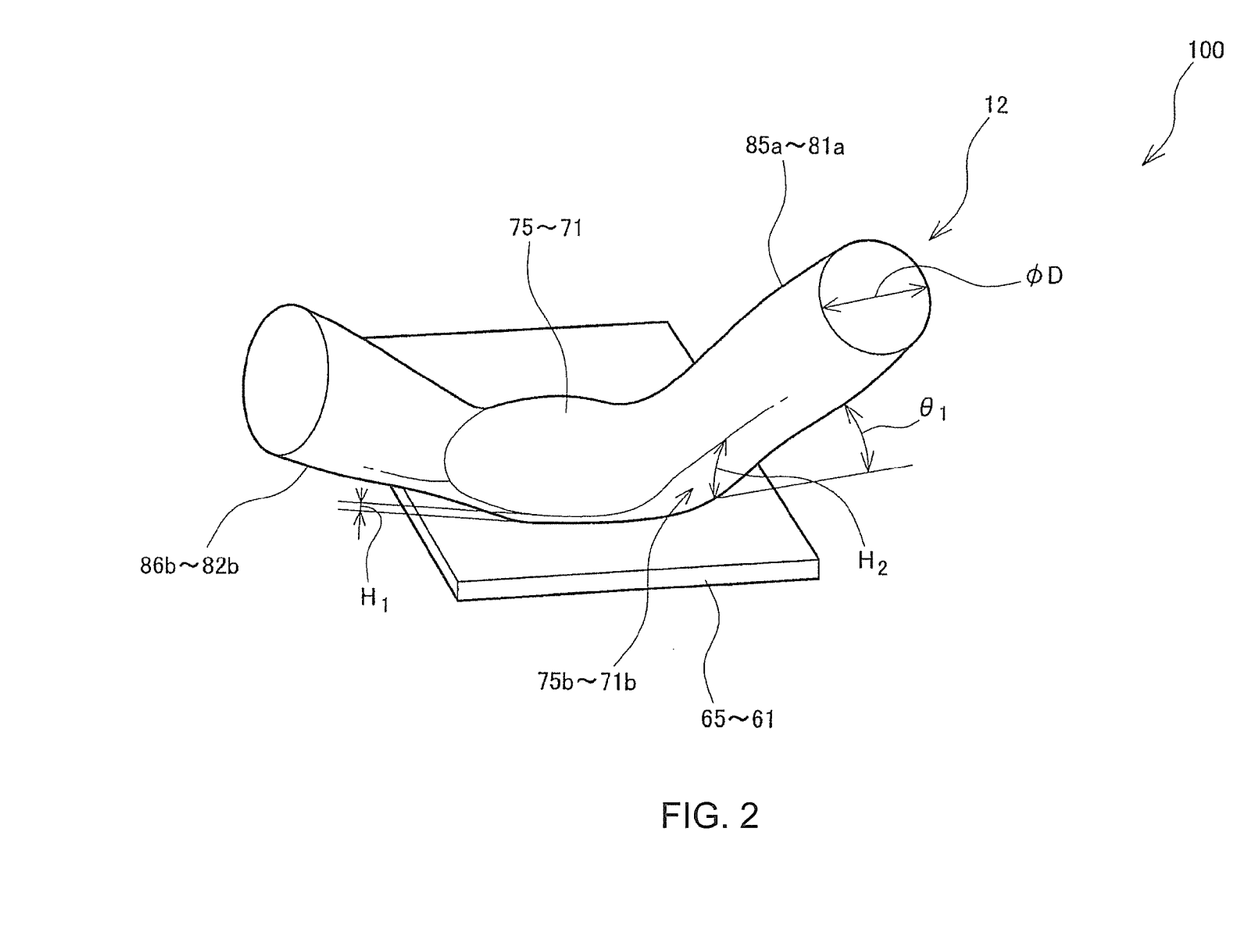
FIG. 2 is a perspective view showing a bonding portion on the semiconductor device manufactured by a method for manufacturing semiconductor device according to an exemplary embodiment of the present invention.

Next, with reference to FIGS. 2 to 4, details of the bonding portions 75 to 71, the ending end portions 86b to 82b of the looping portions 86 to 82, and the starting end portions 85a to 81a of the looping portions 85 to 81 on the semiconductor device 100 will be described. As shown in FIG. 2, the bonding portions 75 to 71 are in an oval flat-plate shape with thickness (height) $H_1$, and the ending end portions 86b to 82b of the looping portions 86 to 82 and the starting end portions 85a to 81a of the looping portions 85 to 81 extend obliquely upward from the longer-diameter ends of the bonding portions 75 to 71, respectively, and have a cross-sectional shape changing from a flat shape into a circle with diameter D. As shown in FIG. 2, the starting end portions 85a to 81a of the looping portions 85 to 81 extend obliquely upward at angle $\theta_1$ with respect to the surface of the pads 66 to 61, and the thickness (height) of heel portions 75b to 71b is thickness (height) $H_2$.

Figure 3:
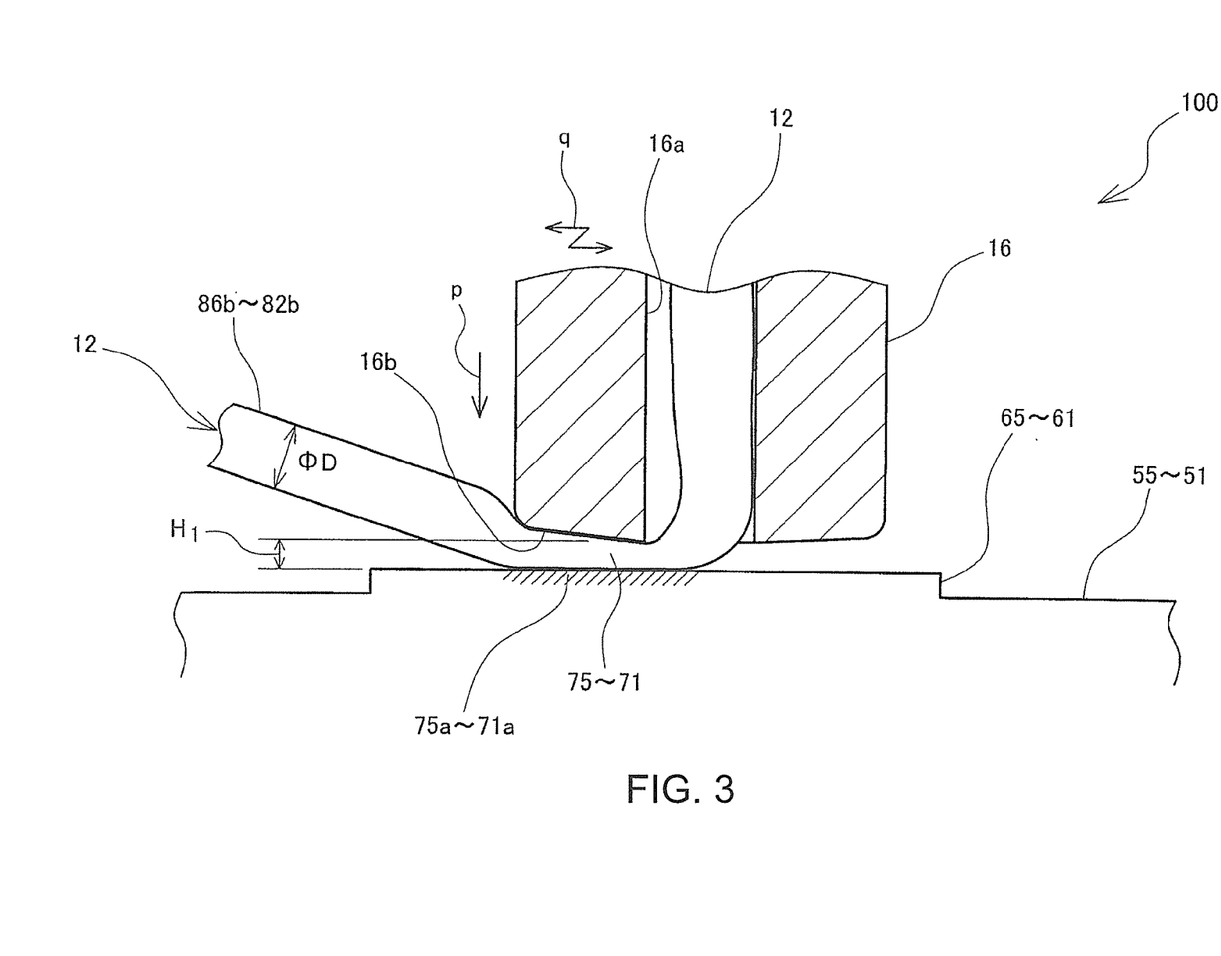
FIG. 3 is an explanatory diagram illustrating a step of forming the bonding portion on the semiconductor device manufactured by a method for manufacturing semiconductor device according to an exemplary embodiment of the present invention.

As shown in FIG. 3, the bonding portions 75 to 71 are formed by pressing a tip surface 16b of a capillary 16 against a side surface of the wire 12 as shown by arrow p in FIG. 3, crushing the wire 12 with a circular section of diameter D into a circular or oval flat-plate shape with thickness (height) $H_1$. Thickness (height) $H_1$ of the bonding portions 75 to 71 is a thickness (height) of about ¼ to ½ of diameter D of the wire 12. The wire 12 is horizontally ultrasonically vibrated as shown by arrows q in lateral directions in FIG. 3 while being crushed into a flat shape with the tip surface 16b of the capillary 16. With this, metal-bonding portions 75a to 71a shown in FIG. 3 are formed, and the side surface of the wire 12 is metal-bonded onto the pads 65 to 61.

Figure 4:
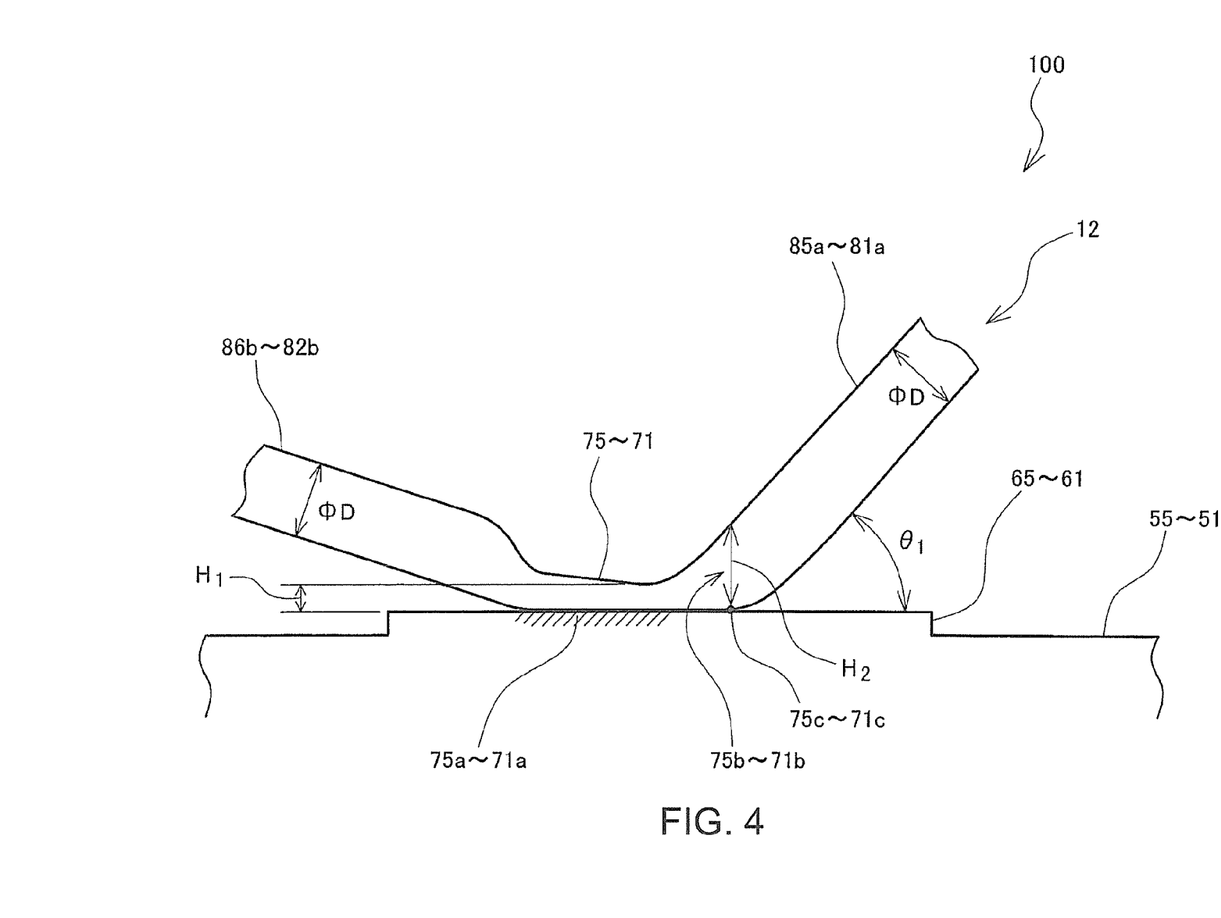
FIG. 4 is a side view of the bonding portion on the semiconductor device manufactured by a method for manufacturing semiconductor device according to an exemplary embodiment of the present invention.

As shown in FIG. 4, the side surface of the wire 12 is in contact with the surface of the pads 65 to 61 at portions adjacent to the metal-bonding portions 75a to 71a of the bonding portions 75 to 71, and rises from the surface of the pads 65 to 61 at points 75c to 71c in FIG. 4, extending obliquely upward at angle $\theta_1$ and connecting to the starting end portions 85a to 81a of the looping portions 85 to 81. Portions connecting from the bonding portions 75 to 71 through the points 75c to 71c to the starting end portions 85a to 81a of the looping portions 85 to 81 shown in FIG. 4 constitute the heel portions 75b to 71b. The section of the heel portions 75b to 71b on the side of the bonding portions 75 to 71 is in a flat shape of ¼ to ½ of diameter D of the wire 12 like the bonding portions 75 to 71, and changes into a circular cross-sectional shape with diameter D like the wire 12 toward the starting end portions 85a to 81a. As shown in FIG. 4, thickness (height) $H_2$ of the heel portions 75b to 71b at the points 75c to 71c is about ½ to ⅘ of diameter D of the wire 12, a thickness (height) of about twice the thickness (height) of the bonding portions 75 to 71.

The bonding portions 75 to 71 are crushed only to thickness (height) $H_1$ of ¼ to ½ of diameter D of the wire 12, and thus have strength enough to connect to the heel portions 75b to 71b. Thickness (height) $H_2$ of the heel portions 75b to 71b is a thickness (height) that allows the wire 12 to connect from the heel portions 75b to 71b to the starting end portions 85a to 81a of the looping portions 85 to 81 without causing damage such as cracks during looping. Angle $\theta_1$ of the heel portions 75b to 71b is preferably set to about 45° to 60°. Since the input voltage of an ultrasonic transducer is set to about 1.5 times that in normal second bonding to form the bonding portions 75 to 71 as described below, the metal-bonding portions 75a to 71a are adequately formed even by a small amount of crushing, providing a sufficient bond strength between the side surface of the wire 12 and the pads 66 to 61, and thus preventing the wire 12 from coming off the pads 66 to 61 during looping.

In the above-described semiconductor device 100, thickness (height) $H_1$ of the bonding portions 75 to 71 has been described as ¼ to ½ of diameter D of the wire 12, but is not limited to this, and can be 8/30 to 12/30 of diameter D of the wire 12, for example, or is more preferably 9/30 to 11/30 or about ⅓ of diameter D of the wire 12. Thickness (height) $H_2$ of the heel portions 75b to 71b has been described as ½ to ⅘ of diameter D of the wire 12, but is not limited to this, and can be 16/30 to 24/30 of diameter D of the wire 12, for example, or is more preferably 18/30 to 22/30 or about ⅔.

Figure 5:
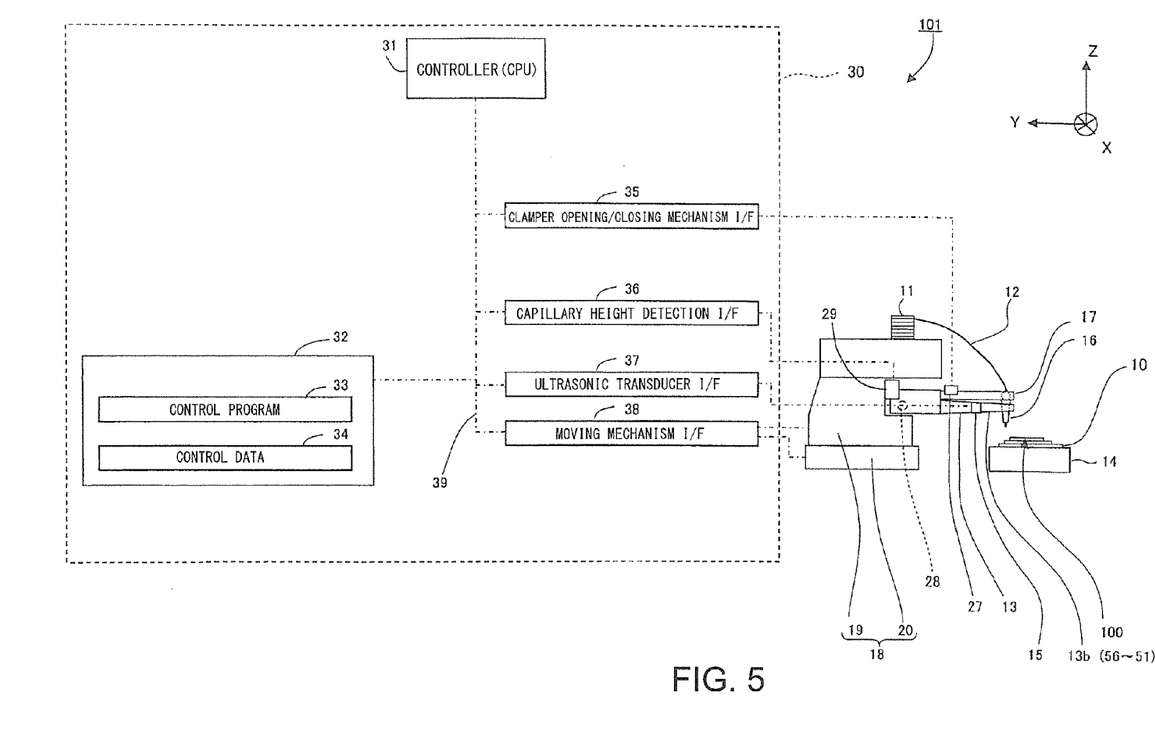
FIG. 5 is a system diagram of a wire bonding apparatus for manufacturing the semiconductor device manufactured by a method for manufacturing semiconductor device according to an exemplary embodiment of the present invention.

Next, with reference to FIGS. 5 to 8, a process of manufacturing the semiconductor device 100 described with reference to FIGS. 1 to 4 by a wire bonding apparatus 101 will be described. First, with reference to FIG. 5, the wire bonding apparatus 101 used for manufacturing the semiconductor device 100 will be described. In FIG. 5, signal lines are shown by dashed dotted lines. As shown in FIG. 5, the wire bonding apparatus 101 includes an XY table 20, a bonding head 19 installed on the XY table 20, and a bonding stage 14 that fixes the substrate 10 by suction. A bonding arm 13 to be driven around a rotation center 28 by a Z-direction motor is attached to the bonding head 19. An ultrasonic horn 13b is attached to the distal end of the bonding a 13. The distal end of the ultrasonic horn 13b is configured to move in an arc toward or away from the surface of the bonding stage 14. The distal end of the ultrasonic horn 13b moves in a Z direction, a vertical direction, in the vicinity of the surface of the bonding stage 14. An ultrasonic transducer 15 is attached to the root of the ultrasonic horn 13b, and is configured to ultrasonically vibrate the capillary 16 attached to the distal end of the ultrasonic horn 13b. The XY table 20 and the bonding head 19 constitute a moving mechanism 18. The moving mechanism 18 can move the bonding head 19 to any position in a plane along the surface of the bonding stage 14 (in an XY plane) by the XY table 20, and can move the distal end of the ultrasonic horn 13b attached to the distal end of the bonding arm 13 and the capillary 16 attached to the distal end of the ultrasonic horn 13b in XYZ directions as desired.

As shown in FIG. 5, the wire bonding apparatus 101 performs detection of the position and control of the operation of each unit by a controller 31 having a CPU inside. The XY table 20 has a built-in XY position detection means that detects the XY-direction position of the bonding head 19. A capillary height detector 29 that detects the height in the Z direction of the tip of the capillary 16 by detecting the rotation angle of the bonding arm 13 around the rotation center 28 is provided to the bonding head 19. The capillary height detector 29 can be configured to directly detect the position of the distal end of the bonding arm 13 or the tip of the capillary 16 instead of detecting the rotation angle. The capillary height detector 29 can be of a non-contact type or of a contact type.

A detection signal of the capillary height detector 29 is input via a capillary height detection interface 36 through a data bus 39 into the controller 31 including the CPU. The moving mechanism 18 including the XY table 20 and the bonding head 19, a damper opening/closing mechanism 27, and the ultrasonic transducer 15 are connected via a moving mechanism interface 38, a clamper opening/closing mechanism interface 35, and an ultrasonic transducer interface 37, respectively, through the data bus 39 to the controller 31. Each unit is configured to operate under a command from the controller 31.

A storage unit 32 is connected to the data bus 39. In the storage unit 32, a control program 33 to control overall bonding control and control data 34 necessary for position detection processing and control command output operation performed by the controller 31 are stored. The controller 31, the data bus 39, the storage unit 32, and the interfaces 35 to 38 are integrated into a computer 30.

A method of manufacturing the semiconductor device 100 shown in FIG. 1 by the wire bonding apparatus 101 configured as above will be described. As shown in FIG. 5, the substrate 10 on which the semiconductor chips 56 to 51 of different sizes are stacked and fixed stepwise is fixed by suction to the surface of the bonding stage 14 by a die bonder unit or the like not shown (FIG. 5 shows the layers reduced in number). As shown in the process (a) of FIG. 6, the capillary 16 is positioned directly above the pad 66 on the semiconductor chip 56 in the uppermost tier, and the height of the tip is height C1.

Figure 6:
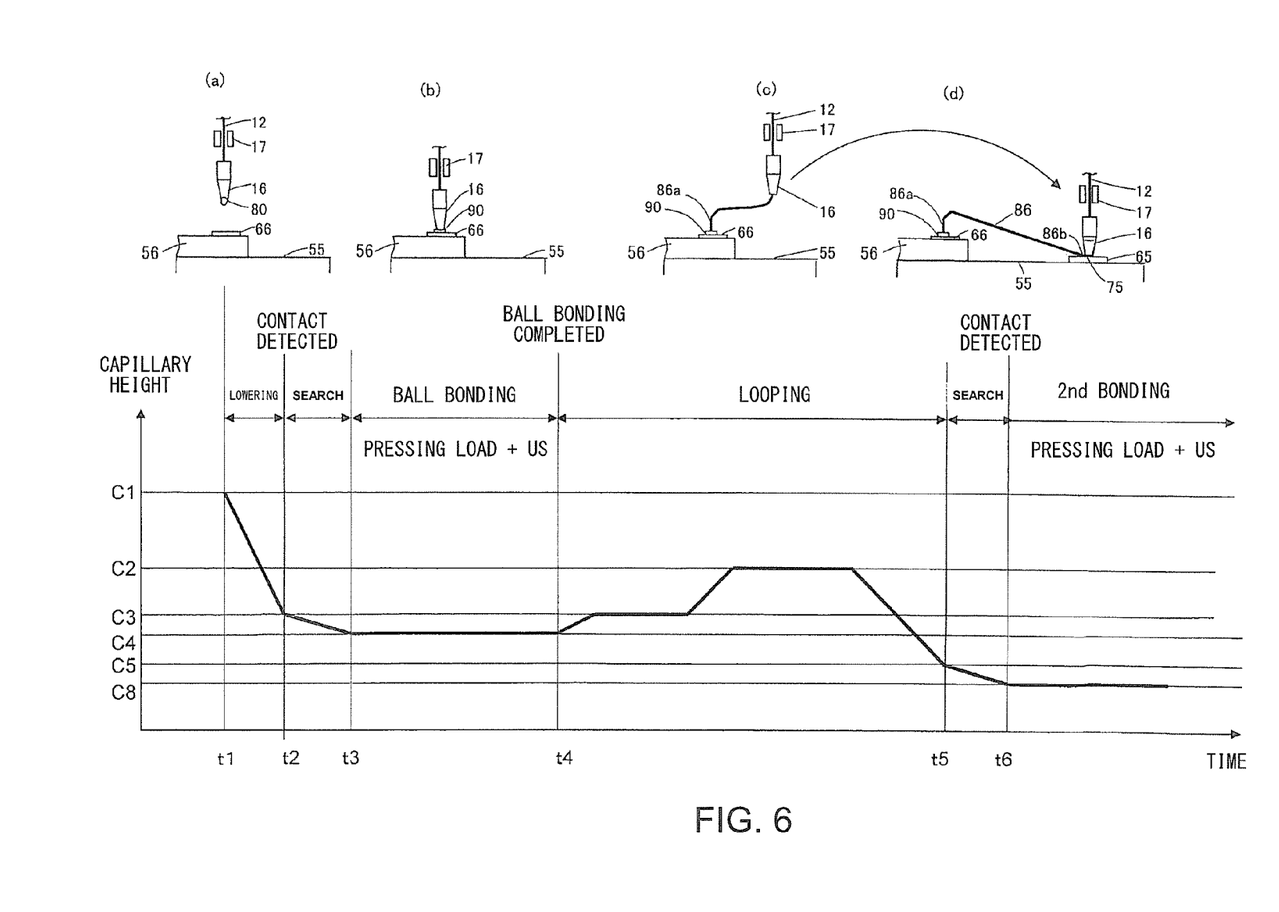
FIG. 6 is an explanatory diagram illustrating processes (a)~(d) of manufacturing the semiconductor device using the wire bonding apparatus shown in FIG. 5.

At time t1 in FIG. 6, the controller 31 starts ball bonding, lowering the capillary 16 from height C1 toward the pad 66 on the semiconductor chip 56 in the uppermost tier. The height of the capillary 16 is detected by the capillary height detector 29 shown in FIG. 5, and is input through the capillary height detection interface 36 into the controller 31. When receiving a signal that the height of the capillary 16 has been lowered to height C3 at time t2 in FIG. 6, the controller 31 reduces a lowering speed of the capillary 16 and lowers the capillary 16 further, searching whether a free air ball 80 at the tip of the capillary 16 contacts the surface of the pad 66. When detecting a signal that the free air ball 80 has contacted the surface of the pad 66 with the capillary 16 at height C4 at time t3 in FIG. 6, the controller 3 lowers the capillary 16 further, pressing the free air ball 80 against the surface of the pad 66 to form the press-bonded ball 90. At the same time, the controller 31 energizes the ultrasonic transducer 15 shown in FIG. 5 to generate ultrasonic vibrations, ultrasonically vibrating the press-bonded ball 90 for a predetermined time with the capillary 16, and thereby metal-bonding it to the surface of the pad 66. For the detection of contact, for example, when a signal detected by the capillary height detector 29 does not change for a predetermined unit time, the free air ball 80 can be determined to be in contact. Alternatively, a voltage can be applied across the semiconductor chip 56 and the wire 12 to detect the flow of current across the semiconductor chip 56 and the wire 12.

When the ball bonding is completed at time t4 in FIG. 6, the controller 31 starts second bonding as shown in processes (c) and (d) of FIG. 6. The controller 31 raises the capillary 16 to height C2, and then moves the tip of the capillary 16 in an arc toward the pad 65 on the semiconductor chip 55 in the next tier to move the capillary 16 to directly above the pad 65, and at the same time lowers the capillary 16 to height C5. When the height of the capillary 16 becomes C5 at time t5 in FIG. 6, the controller 31 reduces a lowering speed of the capillary 16, and lowers the capillary 16 further, searching whether a side surface of the wire 12 at the tip of the capillary 16 contacts the surface of the pad 65. When detecting a signal that the side surface of the wire 12 has contacted the surface of the pad 65 with the capillary 16 at height C8 at time t6 in FIG. 6, the controller 31 presses the tip surface 16b of the capillary 16 against the side surface of the wire 12 as shown in FIG. 3. The controller 31 detects the amount of sinking of the capillary 16, that is, the amount of crushing of the wire 12 by the capillary height detector 29 shown in FIG. 5, crushes the wire 12 by about 2/3 of diameter D of the wire 12, and presses the wire 12 until thickness (height) $H_1$ of the bonding portion 75 becomes about 1/3 of diameter D of the wire 12. When thickness (height) $H_1$ of the bonding portion 75 becomes about 1/3 of diameter D of the wire 12, pressing is stopped. Simultaneously with the pressing of the wire 12, the controller 31 energizes the ultrasonic transducer 15 shown in FIG. 5 to generate ultrasonic vibrations, ultrasonically vibrating the bonding=portion 75 for a predetermined time with the capillary 16, and thereby forming the metal-bonding portion 75a between the bonding portion 75 and the surface of the pad 65. When the bonding portion 75 is formed at time t7 shown in FIG. 7, the pad 66 and the pad 65 are connected with the looping portion 86. The looping portion 86 has the starting end portion 86a on the pad 66 side and the ending end portion 86b on the pad 65 side as described with reference to FIGS. 2 and 4, and the ending end portion 86b connects to the bonding portion 75. When the bonding portion 75 is formed, the second bonding to the pad 65 is completed. When the second bonding is completed, the wire 12 inserted through a hole 16a of the capillary 16 extends substantially vertically upward from the pad 65 as shown in FIG. 3.

Figure 7:
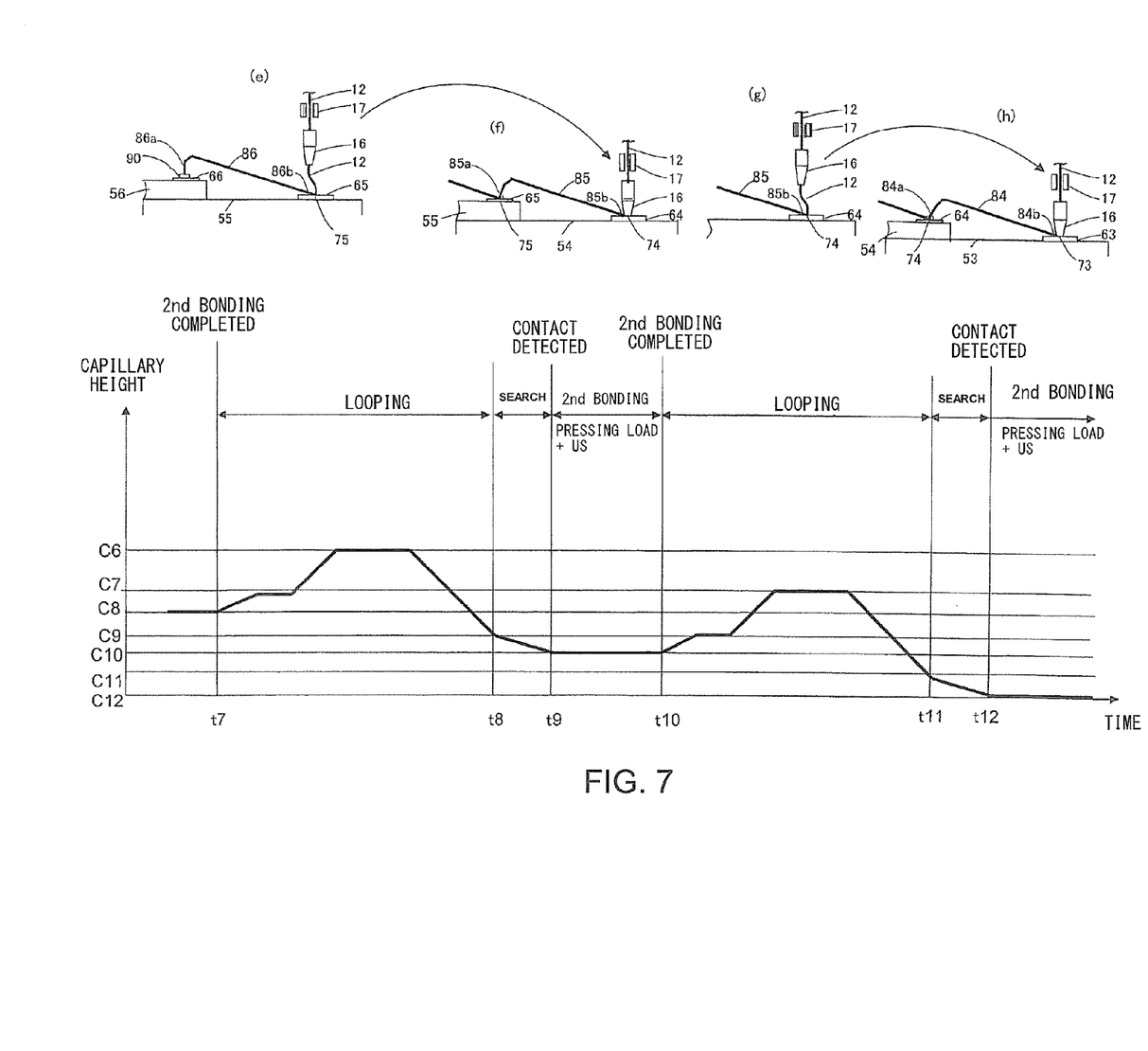
FIG. 7 is an explanatory diagram illustrating processes (e)~(h) of manufacturing the semiconductor device using the wire bonding apparatus shown in FIG. 5.
Figure 8:
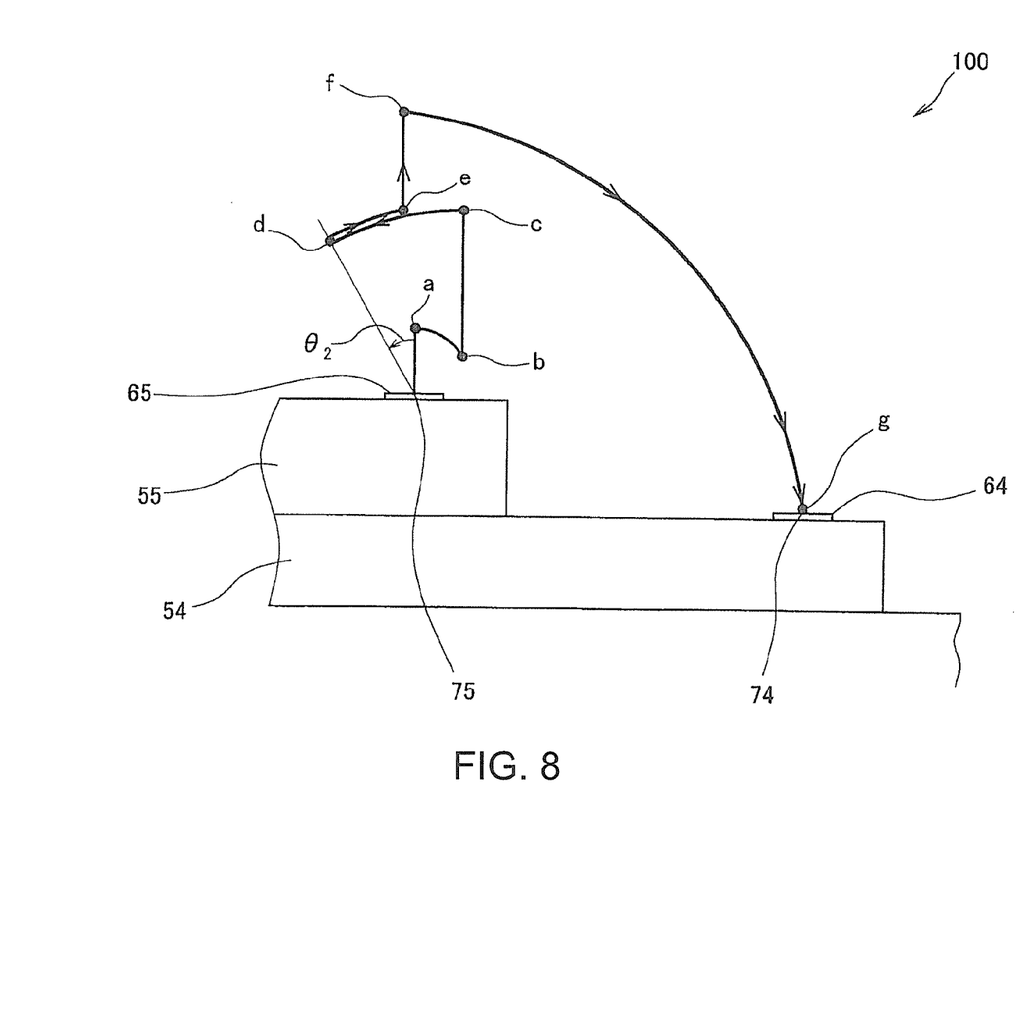
FIG. 8 is an explanatory diagram illustrating a path of the tip of a capillary in a looping step during manufacturing of the semiconductor device.

When the second bonding to the pad 65 is completed, the controller 31 performs looping to move the tip of the capillary 16 as shown in FIG. 8. The controller 31 raises the capillary 16 vertically upward from the pad 65 to point a in FIG. 8 (a first raising step). Next, the controller 31 moves the capillary 16 obliquely downward in an arc from point a to point b shown in FIG. 8, that is, from the pad 65 toward the pad 64 to which bonding is performed next (a first obliquely moving step). Next, the controller 31 raises the capillary 16 vertically from point b to point c (a second raising step). Upon moving the capillary 16 to point c, the controller 31 performs a reverse step. In the reverse step, the capillary 16 is moved obliquely downward in an arc from point c in a direction opposite to the next pad 64 to point d. Point d is a point at which an angle with respect to a line perpendicular to the pad 65 and passing through the bonding portion 75 (the path of the capillary 16 in the first raising step) becomes 10° to 20°. When the capillary 16 is moved to point d, the wire 12 provided with a bend extends from the bonding portion 75 to the tip of the capillary 16 as shown in the process (e) of FIG.7. Next, the controller 31 moves the capillary 16 obliquely upward along the path of the capillary 16 from point c to point d in the previous reverse step toward the next pad 64 to position the capillary 16 at point e directly above the pad 65 (a second obliquely moving step). Then, the controller 31 raises the capillary 16 vertically again from point e to point f (a third raising step). Thereafter, the controller 31 moves the capillary 16 in an arc from point f to point g directly above the pad 64. Thus, by moving the capillary 16 from the pad 65 as in the first raising step, the first obliquely moving step, the second raising step, the reverse step, the second obliquely moving step, and the third raising step, then moving the capillary 16 in an arc to point g directly above the pad 64, the heel portions 75b to 71b and the starting end portion 85a of the looping portion 85 in a shape as described with reference to FIGS. 2 and 4 are formed. In particular, in the reverse step, by moving the capillary 16 to point d at which an angle with respect to a line perpendicular to the pad 65 and passing through the bonding portion 75 (the path of the capillary 16 in the first raising step) becomes 10° to 20°, thickness (height) $H_2$ of the heel portion 75b and obliquely upward angle $\theta_1$ of 45° to 60° are formed.

When the capillary 16 is lowered to height C9 at time t8 shown in FIG. 7, as in the earlier formation of the bonding portion 75 to the pad 65, the controller 31 reduces the lowering speed of the capillary 16, and performs a searching operation to detect whether a side surface of the wire 12 at the tip of the capillary 16 contacts the pad 64. When detecting a signal that the side surface of the wire 12 has contacted the surface of the pad 64 with the capillary 16 at height C10 at time t9 in FIG. 7, the controller 31 presses the tip surface 16b of the capillary 16 against the side surface of the wire 12 as shown in FIG. 3. While controlling the amount of sinking of the capillary 16 by the capillary height detector 29, the controller 31 presses the wire 12 until thickness (height) $H_1$ of the bonding portion 74 becomes about 1/3 of diameter D of the wire 12, and at the same time energizes the ultrasonic transducer 15 to generate ultrasonic vibrations, ultrasonically vibrating the bonding portion 74 for a predetermined time with the capillary 16, thereby forming the metal-bonding portion 74a between the bonding portion 74 and the surface of the pad 64. When the bonding portion 74 is formed at time t10 in FIG. 7, the pad 65 and the pad 64 are connected with the looping portion 85 having the starting end portion 85a and the ending end portion 85b. When the bonding portion 74 is formed, the second bonding to the pad 64 is completed.

When the second bonding to the pad 64 is completed at time t10 in FIG. 7, as in the connection between the pad 65 and the pad 64 described earlier, as shown in processes (g) and (h) of FIG. 7, the controller 31 moves the capillary 16 from the pad 64 in a path from points a to f shown in FIG. 8, and then loops the capillary 16 toward the pad 63. When the capillary 16 is at height C11 at time t11 in FIG. 7, the controller 31 reduces the lowering speed of the capillary 16, and lowers the capillary 16 until a side surface of the wire 12 contacts the surface of the pad 63 while performing searching. When detecting contact at time t12 in FIG. 7, the controller 31 presses the wire 12 against the pad 63 while detecting the height of the capillary 16 by the capillary height detector 29, and at the same time applies a voltage to the ultrasonic transducer 15, ultrasonically vibrating the bonding portion 73, and thereby forming the metal-bonding portion 73a shown in FIG. 3.

Subsequently, the pad 63 and the pad 62, and the pad 62 and the pad 61 are sequentially connected with the single common wire 12 in the same manner. When second bonding to the pad 61 is completed, the controller 31 loops the capillary 16 toward the electrode 70 on the substrate 10, performs normal second bonding onto the electrode 70 on the substrate 10, then raises the capillary 16, then closes a damper 17 shown in FIG. 5 and raises the capillary 16 further, cutting off the wire 12, and completes bonding of the single wire 12. Here, in the normal second bonding to the electrode 70 on the substrate 10, in order to allow smooth cutting of the wire 12, the amount of crushing of the wire 12 is twice or more the amount of crushing of the wire 12 during the formation of the bonding portions 75 to 71, and the pressing load is also much greater than the pressing load during the formation of the bonding portions 75 to 71. In contrast, the greater pressing load allows adequate metal-bonding between the wire 12 and the electrode 70 even under fewer ultrasonic vibrations. Thus, a voltage applied to the ultrasonic transducer 15 is smaller than the voltage during the formation of the bonding portions 75 to 71, and is about 1/1.5, for example.

In this exemplary embodiment described above, the amount of crushing of the wire 12 is smaller, about half the amount of crushing during normal second bonding in which the wire 12 is cut off after bonding to form a wire tail, and the pressing load to the wire 12 is smaller. Thus, direct bonding of the side surface of the wire 12 to the surface of the pads 65 to 61 on the semiconductor chips 55 to 51 causes less damage to the semiconductor chips 55 to 51. Further, application of ultrasonic vibrations is performed by applying a voltage about 1.5 times that during the normal second bonding to the ultrasonic transducer 15, allowing the metal-bonding portions 75a to 71a shown in FIG. 3 to be adequately formed even under a smaller pressing load, and ensuring the bond strength between the wire 12 and the pads 65 to 61. Further, by setting thickness (height) $H_1$ of the bonding portions 75 to 71 to a thickness (height) of about ⅓ of diameter D of the wire 12, the ending end portions 86b to 82b of the looping portions 86 to 82 and the starting end portions 85a to 81a of the looping portions 85 to 81 smoothly connect to the bonding portions 75 to 71 without causing cracks or the like. Thus, by favorably bonding the side surface of the wire 12 to the pads 65 to 61, the pads 65 to 61 can be connected with the single wire 12.

In the description of this exemplary embodiment, the amount of crushing of the wire 12 is controlled by detecting the height of the capillary 16 by the capillary height detector 29 to make the height of the bonding portions 75 to 71 about ⅓ of diameter D of the wire 12. Alternatively, with the relationship between the pressing load and the amount of crushing of the wire 12 mapped with diameter D or material of the wire 12, the amount of crushing of the wire 12 can be controlled by detecting the pressing load of the capillary 16 to make the height of the bonding portions 75 to 71 about ⅓ of diameter D of the wire 12. In this case also, the pressing load can be made lower than that in the normal second bonding, thus reducing damage to the semiconductor chips 55 to 51.

As described above, the wire bonding method in this exemplary embodiment allows connecting of the common wire 12 with a smaller bonding count while reducing damage to the semiconductor chips 55 to 51, and thus allows efficient manufacturing of the semiconductor device 100. Further, the semiconductor device 100 has the pads 65 to 61 on the semiconductor chips 55 to 51 sequentially connected with the single wire 12, thus forming a single metal-bonded surface between the pads 65 to 61 and the wire 12. Consequently, the continuity resistance between the pads 65 to 61 and the common wire 12 is reduced compared to the case where bumps are formed on the pads 65 to 61 for bonding. This allows a reduction in electrical connection resistance between the pads 65 to 61 to provide a highly reliable semiconductor device.

Next, another semiconductor device 100 will be described with reference to FIG. 9. The same portions as those in the semiconductor device 100 described earlier with reference to FIGS. 1 to 8 are denoted by the same reference numerals and will not be described. In the semiconductor device 100 described earlier with reference to FIGS. 1 to 8, the pads 66 to 61 on the semiconductor chips 56 to 51 have been described as having a shape protruded from the surface of the respective semiconductor chips 56 to 51. Alternatively, pads 66 to 61 on semiconductor chips 56 to 51 can be recessed portions recessed below the surface of the semiconductor chips 56 to 51. When a side surface of a wire 12 is pressed against the pads 65 to 61 in such a recessed shape to form bonding portions 75 to 71, it is necessary to prevent the tip surface 16b of the capillary 16 shown in FIG. 3 from hitting the surface of the semiconductor chips 55 to 51. In this case, the amount of sinking of the capillary 16 during bonding is controlled, so that thickness (height) $H_1$ of the bonding-portions 75 to 71 becomes higher than recess depth $D_1$ of the pads 65 to 61. When recess depth $D_1$ is greater than about ⅓ of diameter D of the wire 12, thickness (height) $H_1$ of the bonding portions 75 to 71 is greater than ⅓. Therefore, in order to ensure the bond strength of metal-bonding portions 75a to 71a of the bonding portions 75 to 71, a voltage input to the ultrasonic transducer 15 can be made greater. Other than the above respect, the semiconductor device 100 as shown in FIG. 9 is the same as the semiconductor device 100 described with reference to FIGS. 1 to 8, and its manufacturing process is also the same.

Figure 9:
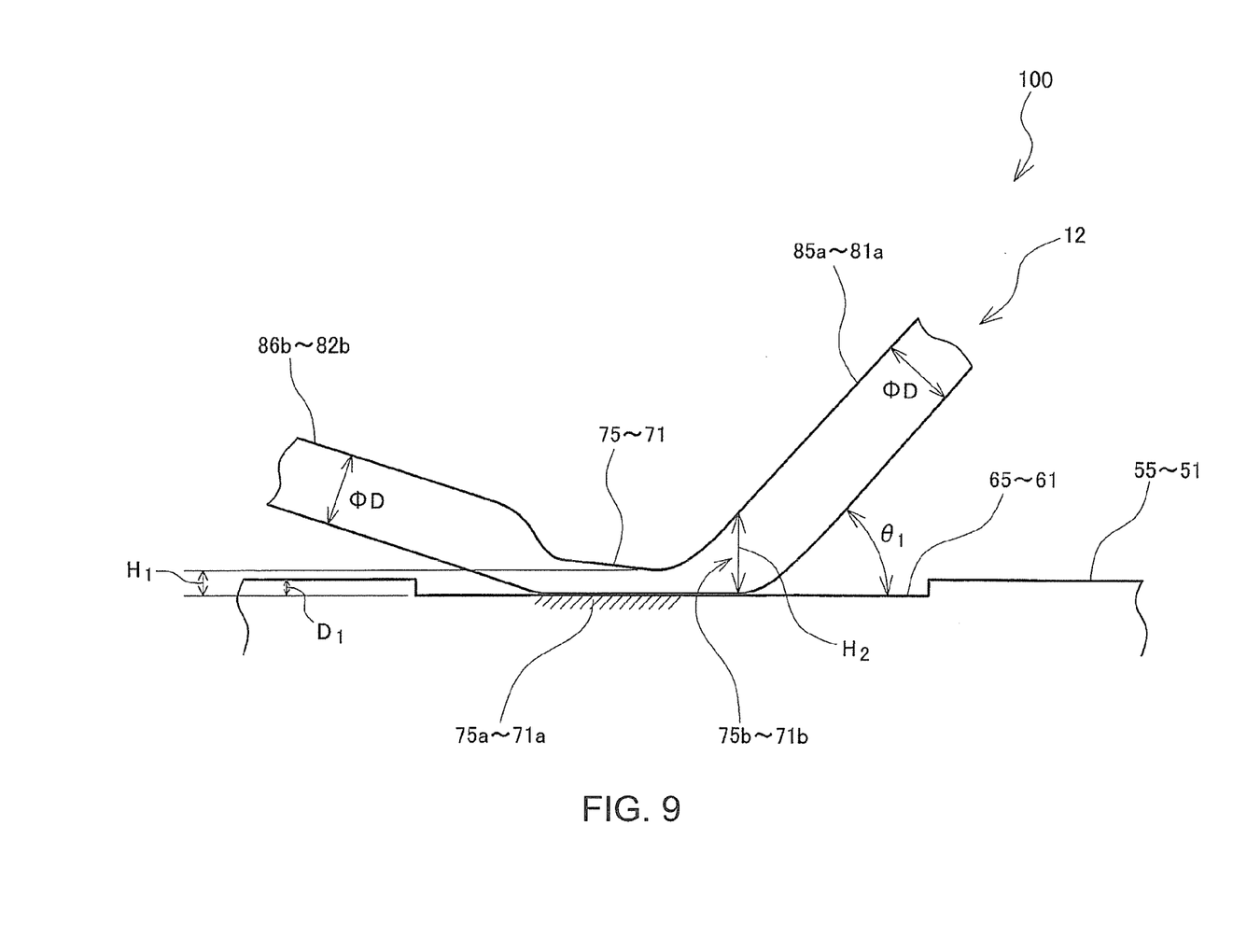
FIG. 9 is a side view of a bonding portion on another semiconductor device.

The semiconductor device 100 as shown in FIG. 9 has an effect of allowing bonding to be performed in a short time even when the pads 65 to 61 are recessed below the surface of the semiconductor chips 55 to 51 because the side surface of the wire 12 can be directly bonded to the surface of the pads 65 to 61 without previously forming bumps also on the pads 65 to 61 recessed from the surface of the semiconductor chips 55 to 51 because the bond strength between the wire 12 and the pads 65 to 61 can be provided even when the pads 65 to 61 are recessed below the surface of the semiconductor chips 55 to 51.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A method of manufacturing a semiconductor device, comprising:
- a bonding step of pressing a side surface of a common wire against a first electrode with a capillary and bonding the side surface of the common wire to the first electrode; and
- a looping step of looping the common wire onto a second electrode with the capillary after the bonding step,
- the bonding step and the looping step being repeated alternately to sequentially connect three or more electrodes on semiconductor chips and a substrate with the common wire,
- the looping step comprises:
  - a first raising step of raising the capillary vertically from the first electrode after the bonding step;
  - a first obliquely moving step of moving the capillary obliquely downward toward the second electrode after the first raising step;
  - a second raising step of raising the capillary vertically again after the first obliquely moving step;
  - a reverse step of moving the capillary obliquely downward in a direction opposite to the second electrode after the second raising step;
  - a second obliquely moving step of moving the capillary obliquely upward to directly above the first electrode after the reverse step;
  - a third raising step of raising the capillary vertically again after the second obliquely moving step; and
  - an arcuately moving step of moving the capillary in an arc to directly above the second electrode after the third raising step.

2. The method of manufacturing the semiconductor device according to claim 1 wherein,
  in the bonding step, the common wire is crushed to a thickness of ¼ to ½ of its diameter with the capillary to be made into a flat shape, and at the same time, the common wire is ultrasonically vibrated to be bonded to each of the electrodes.

3. The method of manufacturing the semiconductor device according to claim 1, wherein in the reverse step, the capillary is moved to a point at which an angle with respect to a line perpendicular to the electrode and passing through the bonding portion becomes 10° to 20°.

4. The method of manufacturing the semiconductor device according to claim 1, wherein
  at least one of the electrodes is a pad recessed from a surface of the semiconductor chip, and
  in the bonding step, the common wire is crushed with the capillary to a thickness greater than a recess depth of the pad to be made into a flat shape, and at the same time, the common wire is ultrasonically vibrated to be bonded to the pad.

* * * * *